(12) United States Patent
Jung et al.

(10) Patent No.: US 11,719,664 B2
(45) Date of Patent: Aug. 8, 2023

(54) ELECTRICAL/OPTICAL MULTIMODAL SENSOR USING MULTI-FUNCTIONAL 3D NANO-ARCHITECTURE MATERIALS AND MANUFACTURING METHOD THEREOF

(71) Applicant: Korea Advanced Institute of Science and Technology, Daejeon (KR)

(72) Inventors: Yeon Sik Jung, Daejeon (KR); Hyeuk Jin Han, Daejeon (KR); Seunghee Cho, Daejeon (KR); Gyurac Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 926 days.

(21) Appl. No.: 16/552,120

(22) Filed: Aug. 27, 2019

(65) Prior Publication Data

US 2020/0271609 A1   Aug. 27, 2020

(30) Foreign Application Priority Data

Feb. 26, 2019   (KR) ................. 10-2019-0022222
Jul. 10, 2019   (KR) ................. 10-2019-0082940

(51) Int. Cl.
*G01N 27/27* (2006.01)
*H01L 29/41* (2006.01)
(Continued)

(52) U.S. Cl.
CPC .......... *G01N 27/27* (2013.01); *G01N 21/658* (2013.01); *H01L 29/413* (2013.01); *H01J 37/26* (2013.01)

(58) Field of Classification Search
CPC .... G01N 27/27; G01N 21/658; H01L 29/413; H01J 37/26
See application file for complete search history.

(56) References Cited

U.S. PATENT DOCUMENTS

2014/0007936 A1* 1/2014 Kim .................. H01G 9/204
                                                    264/650
2015/0137836 A1* 5/2015 Kim .................. G01N 27/12
                                                    438/49
(Continued)

FOREIGN PATENT DOCUMENTS

GB   2447360 A  *  9/2008  ............ G11C 11/14
JP   5600981 B2 * 10/2014
(Continued)

OTHER PUBLICATIONS

Spinelli, Enrique, Marcelo Haberman. "Insulating electrodes: a review on biopotential front ends for dielectric skin-electrode interfaces." Physiological measurement 31.10 (2010): S183 (Year: 2010).*

(Continued)

*Primary Examiner* — Kristina M Deherrera
*Assistant Examiner* — Fatemeh Esfandiari Nia
(74) *Attorney, Agent, or Firm* — Verrill Dana, LLP

(57) ABSTRACT

A multimodal sensor of high sensitivity and high selectivity using multifunctional three-dimensional nanostructure having electric and optical sensing ability and a method thereof are provided. The method includes forming multi-layered nanowires including a multifunctional material, transferring the nanowires to a plurality of layers onto a target substrate to form the three-dimensional nanostructure, heat-treating the three-dimensional nanostructure, and forming electrode layers at the three-dimensional nanostructure.

11 Claims, 11 Drawing Sheets

(51) Int. Cl.
*G01N 21/65* (2006.01)
*H01J 37/26* (2006.01)

(56) References Cited

U.S. PATENT DOCUMENTS

| | | | | |
|---|---|---|---|---|
| 2016/0104839 A1* | 4/2016 | Park | ........................ | H01L 45/16 257/4 |
| 2018/0233666 A1* | 8/2018 | Ocola | .................. | H10K 30/152 |
| 2019/0041370 A1* | 2/2019 | Gao | ..................... | G01N 33/004 |

FOREIGN PATENT DOCUMENTS

| KR | 1020130137441 A | 12/2013 |
|---|---|---|
| KR | 1020180115920 A | 10/2018 |

OTHER PUBLICATIONS

Park—KR-20130137441-A—English translation for the purpose of citations in the Office action (Year: 2013).*

JP-5600981-B2—translate (Year: 2014).*

Han, Hyeuk Jin et al., "3D Nano-architecture Materials for Synergistic/Optical Multimodal Sensing Capability", Presented at "14th Samsung Electro-Mechanics Best Paper Award", Nov. 7, 2018, Sponsored by Samsung Electo-Mechanics Corporation.

Jeong, Jae Won et al., "3D Cross-Point Plasmonic Nanoarchitectures Containing Dense and Regular Hot Spots for Surface-Enhanced Raman Spectroscopy Analysis", Advanced Materials, 2016, 28, 8695-8704 DOI: 10.1002/adma.201602603.

* cited by examiner

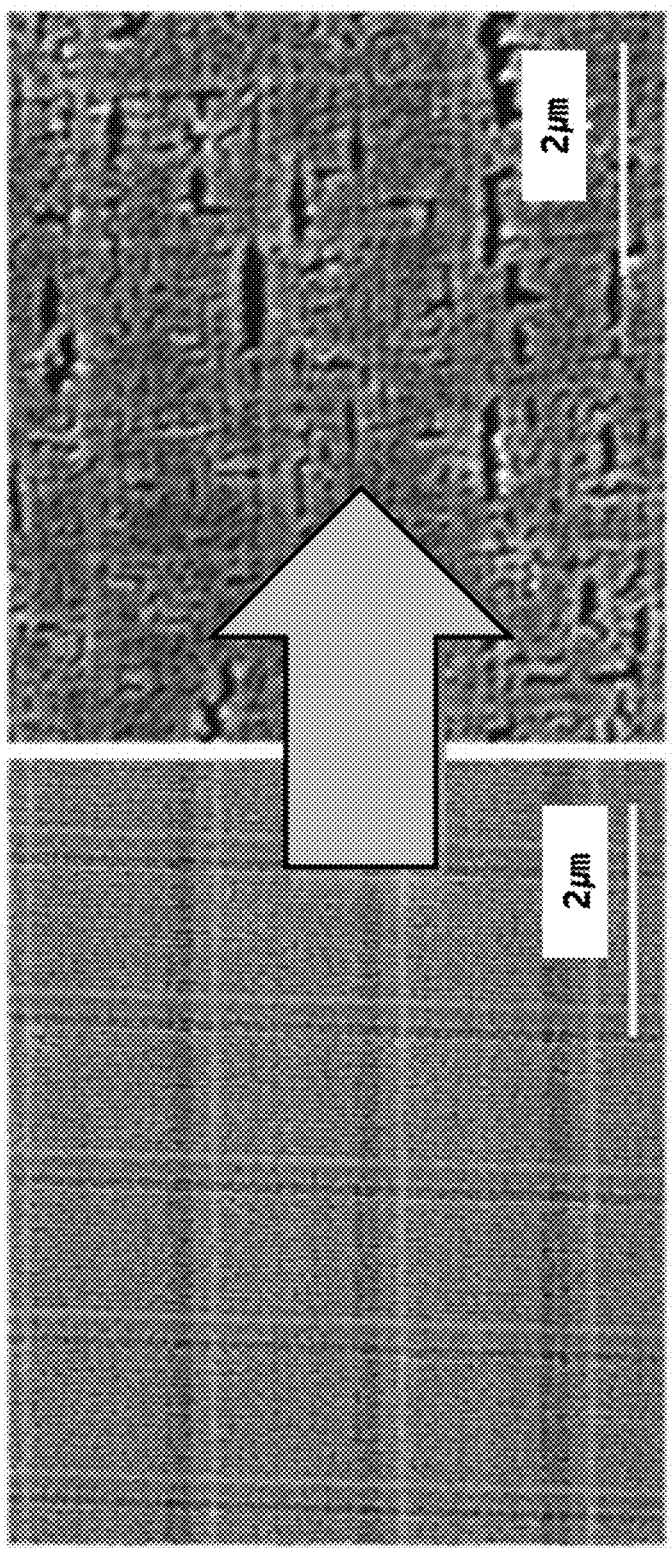

ELECTRICAL/OPTICAL MULTIMODAL SENSOR USING MULTI-FUNCTIONAL 3D NANO-ARCHITECTURE MATERIALS AND MANUFACTURING METHOD THEREOF

CROSS-REFERENCE TO RELATED APPLICATIONS

A claim for priority under 35 U.S.C. § 119 is made to Korean Patent Application No. 10-2019-0022222 filed on Feb. 26, 2019 and No. 10-2019-0082940 filed on Jul. 10, 2019 in the Korean Intellectual Property Office, the entire contents of which are hereby incorporated by reference.

BACKGROUND

Embodiments of the inventive concept described herein relate to a multimodal sensor using multifunctional three-dimensional nanostructure and a manufacturing method thereof, and more particularly, to a method of configuring an ideal sensor having high sensitivity and high selectivity using a multifunctional three-dimensional nanostructure having multimodal sensing capability, which are electrical and optical sensing.

A gas sensor is used in various fields such as gas detection in an environment where toxic gas is generated, prediagnosis of food spoilage, and medical devices. Recently, use of various gases in an industrial site, terrorism detection such as explosive, disease diagnosis, and general household life has exploded to greatly emphasize significance of the gas sensor.

In particular, a conventional examination method in a hospital generally requires expensive equipment and requires to collect blood or tissue of patients to increase inconvenience of the patient and to take a certain period of time until the examination result. In recent years, studies on the diagnosis of diseases using human breath analysis have continuously increased to overcome such disadvantages of the conventional examination. The human respiratory gas analysis is convenient for the patient, low-cost diagnosis, and the analysis result is confirmed in real time.

A gas chromatography (GC) is the most conventional gas analyzer, and has been developed for human respiratory gas analysis equipment using a gas chromatography mass spectroscopy (GC-MS) and applied to clinical applications. The GC-MS is an analytical instrument that has attracted much interest in the field of the respiratory gas analysis and has made the most contribution since creation of this field, but a bag for collecting respiratory gas in the gas analysis process is required and an enrichment system is accompanied when a low-concentration analysis such as the respiratory gas is performed, and the collecting bag or the enrichment system often cause experimental errors. A sample collection process using the collecting bag, the enrichment system, and calibration required for quantification process have contributed to diversity and performance improvement of the function of the GC-MS but the GC-MS has a big disadvantage in accompanying with professional experience and meticulous attention. In addition, because the GC-MS shows limitations in terms of price and volume of the analytical instrument, it is time for a new sensor which may easily and inexpensively diagnose and perform determination of the analysis result in real time.

Recently, a gas sensor using a metal oxide material has been used in various fields such as toxic gas detection, atmospheric harmful environment measurement, indoor air quality measurement, and the like. An ultra-sensitive material is developed by applying a nanostructure to the gas sensor and is used to diagnose a disease by detecting a biomarker in human exhalation. Meanwhile, although associated technologies configuring the sensor such as big data processing technology, electric signal designing technology, and MEMS technology have considerably developed, selectivity of the gas sensor using the metal oxide material is deteriorated because the gas sensor has a universal principle which uses the reaction of oxygen ions at the metal oxide surface. Accordingly, although the above-described drawbacks are overcome by using sensor array technology, there is a limit of 80% accuracy.

Another technique is an analyzing method using plasmonic effect of a metal nanostructure. This is a measurement method with high selectivity because each molecule shows an inherent vibrational spectrum upon optical excitation. However, the method is not suitable for the quantitative analysis of gas because it takes a long time to reach a maximum response due to poor adsorption of gas rather than liquid or solid.

SUMMARY

Embodiments of the inventive concept provide a multimodal sensor of high sensitivity and high selectivity which detects a harmful substance using an electrical method and an optical method simultaneously.

A conventional multimodal sensor detects signals using different sensing principles based on various materials and precise measurement is possible by obtaining information from a plurality of sensors according to a conventional sensor analysis method. To this end, it is necessary to develop a multimodal sensing material which is capable of measuring at least two principles simultaneously and a multimodal sensing technology having both selectivity and quantification using the multimodal sensing material. Accordingly, it is an object of the inventive concept to provide a method of manufacturing a multifunctional and multimodal sensing material through sophisticated design and process configuration of a nanostructure having a three-dimensional array, which includes a metal oxide material whose electrical conductivity is changed by a sensed gas and a plasmonic metal material which provides information of an intrinsic vibration peak obtained based on a surface-enhanced Raman scattering (SERS) phenomenon. It could overcomes each drawback of the metal oxide material and the plasmonic metal material, and a new multimodal sensor having both high sensitivity and high selectivity based on the method of manufacturing the multifunctional and multimodal sensing material.

According to the inventive concept, a metal nanostructure has high sensitivity by acting as a catalyst for a reaction between a metal oxide material and a sensed gas and has high selectivity by maximizing an optical signal containing information of the intrinsic molecular structure of the sensed gas based on Raman spectroscopy. Quantitative analysis is possible because an electrical conductivity is changed based on a concentration of a sensed gas absorbed on the metal oxide material and thermal and chemical stability is improved which is known as a disadvantage of metal nanostructure materials by combining metal nanostructures with metal oxide materials.

According to an exemplary embodiment, a method of manufacturing a multimodal sensor using a three-dimensional nanostructure includes forming multi-layered nanowires including a multifunctional material, transferring the multi-layered nanowires to a plurality of layers on a target substrate to form the three-dimensional nanostructure, heat-treating the three-dimensional nanostructure, and forming electrode layers at the heat-treated three-dimensional nanostructure.

The forming of the nanowires may include applying a soft material on a master substrate where master patterns is formed, separating the soft material from the master substrate using an adhesive film and forming the base substrate, which includes the base patterns having a reverse shape of the master patterns, depositing the first functional material on the base patterns, and depositing the second functional material having properties different from the first functional material on the first functional material to form the nanowires.

The forming of the nanowires may include forming the nanowires each having a multi-layered structure where the second functional materials are deposited above and below of the first functional material layer, respectively.

The forming of the three-dimensional nanostructure may include contacting the base substrate provided with the first functional material and the second functional material to the target substrate and transferring the nanowires each including both the first functional material and the second functional material simultaneously onto the target substrate to form the three-dimensional nanostructure.

The forming of the three-dimensional nanostructure may include transferring the multi-layered nanowires each including the first functional material having an electric response and the second functional material having an optical response onto the target substrate to form the three-dimensional nanostructure.

The first functional material may include at least one metal oxide material of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$) and the second functional material may include at least one plasmonic metal material of gold (Au), silver (Ag), aluminum (Al), platinum (Pt), and copper (Cu).

The forming of the nanowires may include depositing the multi-layered nanowires on the base substrate in a vacuum atmosphere using at least one of thermal evaporation, e-beam evaporation, and RF or DC sputtering, and the forming the three-dimensional nanostructure may include contacting and transferring the base patterns where the multi-layered nanowires are deposited, respectively, onto the target substrate to form the three-dimensional nanostructure through continuous printing.

The heat-treating may include heat-treating the three-dimensional nanostructure at a temperature of 500 degrees or more in a heat-treated air atmosphere.

The forming of the multimodal sensor may include the electrode layers of a first electrode pattern and a second electrode pattern at opposite ends of the three-dimensional nanostructure, respectively.

The first electrode pattern and the second electrode pattern are electrically insulated from each other and are formed in an interdigitated type.

According to an exemplary embodiment, a method of manufacturing a multimodal sensor using a three-dimensional nanostructure includes applying a soft material on a master substrate on which a plurality of master patterns is formed, separating the soft material from the master substrate using an adhesive film and forming a base substrate including base patterns each having a reverse phase of each of the master patterns, depositing a first functional material on the base patterns, depositing a second functional material having properties different from a properties of the first functional material on the first functional material to form nanowires, transferring the nanowires each having a multi-layered including both the first functional material and the second functional material simultaneously to a plurality of layers on a target substrate to form the three-dimensional nanostructure, heat-treating the three-dimensional nanostructure, and forming electrode layers on the heat-treated three-dimensional nanostructure to form the multimodal sensor.

According to an exemplary embodiment, a multimodal sensor using a three-dimensional nanostructure includes a target substrate, a three-dimensional nanostructure formed on the target substrate by transferring multi-layered nanowires each including a first functional material and a second functional material simultaneously to a plurality of layers, and electrode layers formed on opposite ends of the three-dimensional nanostructure, respectively.

The three-dimensional nanostructure may be formed by transferring the multi-layered nanowires each including the first functional material, which presents an electrical response, and the second functional material, which has properties different from properties of the first functional material and presents an optical response, simultaneously to the plurality of layers.

The first functional material may include at least one metal oxide material of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$) and the second functional material may include at least one plasmonic metal material of gold (Au), silver (Ag), aluminum (Al), platinum (Pt), and copper (Cu).

The multi-layered nanowires may be deposited on the base substrate using at least one of thermal evaporation, E-beam evaporation, and RF or DC sputtering, and the three-dimensional nanostructure may be formed by contacting and transferring the base patterns where the multi-layered nanowires are deposited, respectively, onto the target substrate, and continuous printing.

The three-dimensional nanostructure may be heat-treated at a temperature of 500 degrees or more in a heat-treated air atmosphere.

The electrode layers may be formed with a first electrode pattern and a second electrode pattern at the opposite ends of the three-dimensional nanostructure, respectively.

The first electrode pattern and the second electrode pattern are electrically insulated from each other and are formed in an interdigitated type.

According to an exemplary embodiment, a multimodal sensor using a three-dimensional nanostructure includes a target substrate, nanowires formed on the target substrate and including a first layer formed with a plasmonic metal material, a second layer formed with a metal oxide material on the first layer, and a third layer formed with the plasmonic metal material on the second layer, a three-dimensional nanostructure formed by transferring the multi-layered nanowires to a plurality of layers, and electrode layers formed at opposite ends of the three-dimensional nanostructure.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 7A and 7B illustrate results of evaluating thermal stability of a multimodal sensor according to an embodiment of the inventive concept.

DETAILED DESCRIPTION

Figure 1:
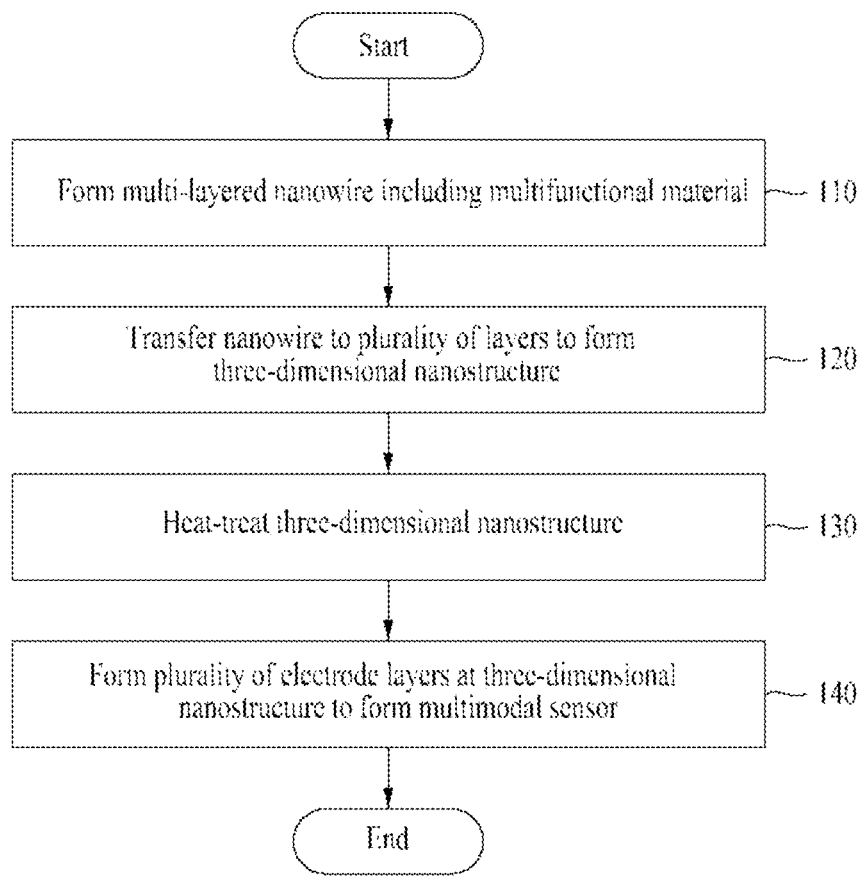
FIG. 1 is a flowchart illustrating a method of manufacturing a multimodal sensor using a three-dimensional nanostructure according to an embodiment of the inventive concept.

Hereinafter, embodiments according to the inventive concept will be described in detail with reference to the accompanying drawings. However, the inventive concept is not limited to or limited by the embodiments. In addition, the same reference numerals shown in the drawings denote the same members.

Further, terminology used herein is a term used for appropriately expressing the preferred embodiment of the inventive concept, which may vary depending on the audience, the intention of the operator, or the practice of the field to which the inventive concept belongs. Therefore, the definitions of these terms should be based on the contents throughout this specification.

Embodiments of the inventive concept provide a sensor having a high performance which is capable of performing simultaneously optical and electrical detection of a chemical substance using a layered structure of a nanowire capable of multimodal sensing.

A multimodal sensor according to an embodiment of the inventive concept optically detects a frequency inherent to a material adsorbed on a plasmonic metal material using frequency enhancement effect of the adsorbed material and simultaneously detects a change signal based on an electrical resistance of a metal oxide material nanowire to obtain quantity of the adsorbed material.

In particular, although a conventional sensor based on the metal oxide material detects various types of gases, selectivity is deteriorated due to limitations of a sensing principle. The conventional plasmonic metal material has a difficulty in control of a structure, and therefore quantitative measurement is difficult.

However, when the multimodal sensing material including both a metal oxide material and a plasmonic metal material is manufactured, the selectivity which is a disadvantage of the metal oxide material may be complemented and quantitative measurement which is a disadvantage of the plasmonic metal material may be performed. Further, the plasmonic metal material is bonded to the metal oxide material to generate catalyst effect, thereby increasing the sensitivity. The plasmonic metal material bonded to the metal oxide material has a synergistic effect of securing structural stability.

Therefore, to achieve the object of the inventive concept, a sensor device capable of performing electrical measurement based on the metal oxide material having improved sensitivity by utilizing an electrode pattern structure and a sensor device capable of performing optical measurement using the plasmonic metal material are fabricated on a single substrate to form the multimodal sensor which complements limitation of each sensor device.

The inventive concept will be described with reference to FIGS. 1 to 9.

FIG. 1 is a flowchart illustrating a method of manufacturing a multimodal sensor using a three-dimensional nanostructure according to an embodiment of the inventive concept.

A method of manufacturing a multimodal sensor using a three-dimensional nanostructure according to an embodiment of the inventive concept includes forming the three-dimensional nanostructure, which is multi-detectable, using a method of forming nanowires each having a multi-layered, heating the three-dimensional nanostructure to be structurally stabilized, and forming an electrode for detecting an electric change to implement an electronic and optical multimodal sensor having high sensitivity and high selectivity.

Referring to FIG. 1, in operation 110, the multi-layered nanowires including a multifunctional material are formed.

In operation 110, nanowires are formed using a method of forming the multi-layered nanowires for multimodal detection. The operation 110 includes a first operation of coating a soft material on a master substrate having a plurality of master patterns formed thereon, a second operation of separating the soft material from the master substrate using an adhesive film to form a base substrate including base patterns each having a reversed phase of each master pattern, a third operation of depositing a first functional material on the base patterns, and a fourth operation of depositing a second functional material having properties different from that of the first functional material on the first functional material to form the nanowires.

In operation 110, the multi-layered nanowires, in which the second functional material is deposited on an upper end and a lower end of the first functional material, may be formed in the third operation and the fourth operation. Here, the first functional material may be at least one metal oxide material of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$), which presents electrical reaction and the second functional material may be at least one plasmonic metal material of gold (Au), silver (Ag), aluminum (Al), platinum (Pt), and copper (Cu), which presents optical reaction.

In addition, the soft material may include at least one of poly(methyl methacrylate) (PMMA), polystyrene (PS), polyvinylpyrrolidone (PVP), poly(4-vinyl pyridine) (P4VP), and poly(2-vinyl pyridine) (P2VP).

According to an embodiment of the inventive concept, the depositing of the soft material on the master substrate may be performed by at least one selected from the group consisting of spin coating, deep coating, and spray coating to form the base substrate.

In one embodiment, the multi-layered nanowire structure may be formed by depositing the second functional material, which is the plasmonic metal material, on the upper and lower ends of the first functional material, which is the metal oxide material. In detail, each nanowire according to an embodiment of the inventive concept is formed in a multi-layered in which the second functional material which is at least one metal selected from the group consisting of gold (Au), silver (Ag), aluminum (Al), platinum (Pt), and copper (Cu) is deposited on one surfaces of the base patterns, the first functional material which is at least one material selected from the group consisting of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$) is deposited on the upper end of the second functional material, and the second functional material which is the plasmonic metal material is deposited on the first functional material in the same manner as described above to form more plasmonic contact points at the upper end of the first functional material.

Here, a layer formed of the second functional material, which is the plasmonic metal material, may have a thickness of 1 nm to 10 nm, and a layer formed of the first functional material, which is the metal oxide material, may have a thickness of 5 nm to 30 nm. The plasmonic metal material is intended to know optical properties of an adsorbed material and the metal oxide material is intended to form an electrical channel for quantitative measurement of the adsorbed material.

Here, in operation 110, the multi-layered nanowires may be deposited on the base patterns in a vacuum atmosphere using at least one of thermal evaporation, E-beam evaporation, and RF or DC sputtering. In operation 120, the nanowires may be deposited at a rate of 1 Å/s or more by electron beam deposition.

In operation 120, the nanowires are transferred to a plurality of layers on a target substrate to form the three-dimensional nanostructure.

Operation 120 may include contacting the base patterns each having the multi-layered nanowire with the first functional material and the second functional material to the target substrate, transferring the nanowires including both the first functional material and the second functional material onto the target substrate, and repeating the above processes to form the three-dimensional nanostructure. In operation 120, the nanostructure having the multi-layered including the first functional material presenting the electrical reaction and the second functional material presenting the optical reaction may be transferred onto the target substrate to form the three-dimensional nanostructure.

For example, in operation 120, for stacking the multi-layered nanowires in a plurality of layers, the base patterns on which the multi-layered nanowires are deposited are weakened in adhesion using an organic solvent, the weakened base patterns are in contact with the target substrate to be transferred thereon, thereby forming the three-dimensional nanostructure through continuous printing.

In detail, in the method for manufacturing the multimodal sensor using the three-dimensional nanostructure according to an embodiment of the inventive concept, adhesive strength between the base patterns and the base substrate, which is an adhesive film, is weakened using an organic solvent vapor. For example, the organic solvent is filled in a chamber, the adhesive film is attached to a lid of a container (or a blocking part of the chamber) such that the base patterns on which the nanowires are formed faces downward, and then the lid is closed to form the vapor evaporated from the organic solvent in the sealed chamber. Thereafter, the vapor of the organic solvent provided for a predetermined time of 10 seconds to 60 seconds reduces separation energy of an interface between the base patterns and the adhesive film which is the base substrate to be easily transferred when contact with the target substrate for 1 second to 5 seconds.

Here, the organic solvent may be carried out in a single solvent or in a mixed solvent containing two or more components. For example, the organic solvent may be acetone, toluene, heptane, isopropyl alcohol or ethanol.

As described above, the base substrate formed with the nanowires, which are separated from the adhesive film serving as the base substrate, is contact with the target substrate to transfer the nanowires onto the target substrate. A residual material on the base substrate may be washed away using the organic solvent. The residual material may be removed by toluene, acetone or a mixed solvent when PMMA is utilized as the base patterns in an embodiment of the inventive concept.

Here, the target substrate may include at least one material selected from the group consisting of silicon (Si), quartz, and alumina ($Al_2O_3$). In detail, the target substrate may be a nonconductive or conductive substrate capable of supporting the three-dimensional nanostructure, and may include a conductive material such as silicon and a nonconductive material such as glass or quartz.

In the method of manufacturing the multimodal sensor using the three-dimensional nanostructure according to an embodiment of the inventive concept, because the transfer is carried out using controlling the adhesive strength by the organic solvent vapor, printing may be performed without an adhesive layer or pretreatment, and the three-dimensional nanostructure may be formed through continuous printing.

That is, in operation 120, the nanowires are repeatedly transferred using the method of manufacturing the multi-layered nanowires to form the three-dimensional nanostructure. As a result, the electric change and the optical change due to the electrical change associated with the metal oxide material and due to amplification of optical oscillation of the target gas adsorbed on the three-dimensional nanostructure of the metal are generated, and the multimodal sensor according an embodiment of the inventive concept may sense optically and electrically at the same time. In addition, the multimodal sensor according to an embodiment of the inventive concept may show amplification effect of electrical and optical signals at a zero-dimensional contact point generated in the multi-layered structure of the three-dimensional nanostructure.

In operation 130, the three-dimensional nanostructure is treated by heating. In operation 130, the three-dimensional nanostructure may be treated by heating at a temperature of 500 degrees or more in a heat-treated air atmosphere.

In operation 130, the three dimensional nanostructure may be heat-treated at a temperature of 500 degrees or more for 1 hour to 6 hours to complete a formation of the nanostructure. In the method of manufacturing the multimodal sensor using the three-dimensional nanostructure according to an embodiment of the inventive concept, through the heat treatment as described above, the metal oxide material may be stabilized and the plasmonic metal material may be changed to nanoparticles to maximize the optical properties of the three-dimensional nanostructure.

In operation 140, electrode layers are formed on the heat-treated three-dimensional nanostructure to form the multimodal sensor.

In operation 140, the electrode layers may include a first electrode pattern and a second electrode pattern, which are formed on both sides of the heat-treated three-dimensional nanostructure, respectively. Here, the first electrode pattern and the second electrode pattern may be electrically insulated and interdigitated.

Figure 2A:
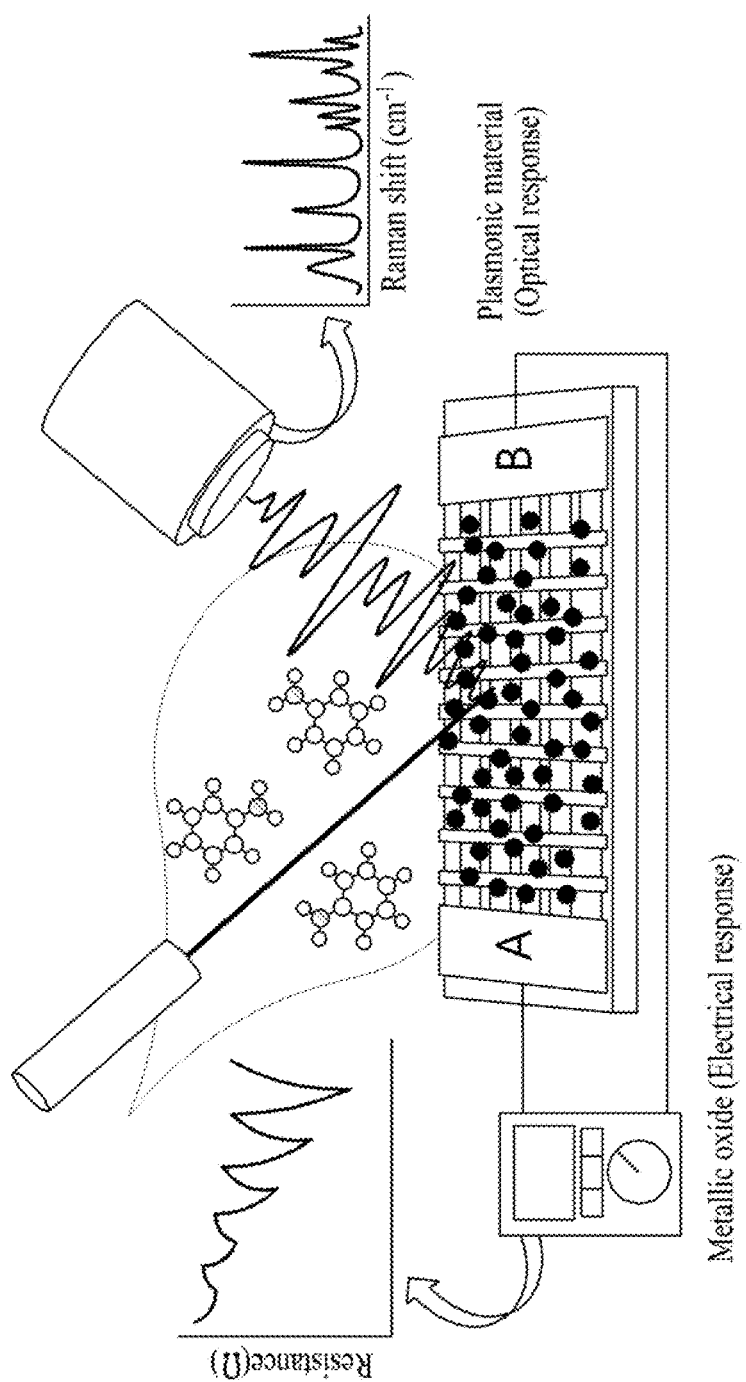
FIG. 2A is a schematic diagram of a multimodal sensor capable of electrical/optical sensing at the same time according to an embodiment of the inventive concept.
Figure 2B:
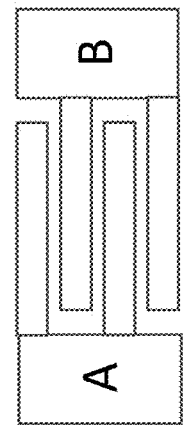
FIG. 2B is a schematic diagram of a pair of interdigitated electrodes.

For example, the electrode layers include two electrode patterns, that is, the first electrode pattern and the second electrode pattern. The first electrode pattern and the second electrode pattern are electrically insulated from each other and are interdigitated. As shown in FIG. 2A, one of electrode pattern ("A" or "B") of the electrode layers may become the first electrode pattern and the other of electrode pattern may become the second electron pattern.

FIG. 2A is a schematic diagram of a multimodal sensor capable of electrical/optical sensing at the same time according to an embodiment of the inventive concept.

Referring to FIG. 2A, the multimodal sensor according to an embodiment of the inventive concept may simultaneously detect electrical and optical responses to the gas and the chemical substance using the metal oxide material and the plasmonic metal material.

Figure 3:
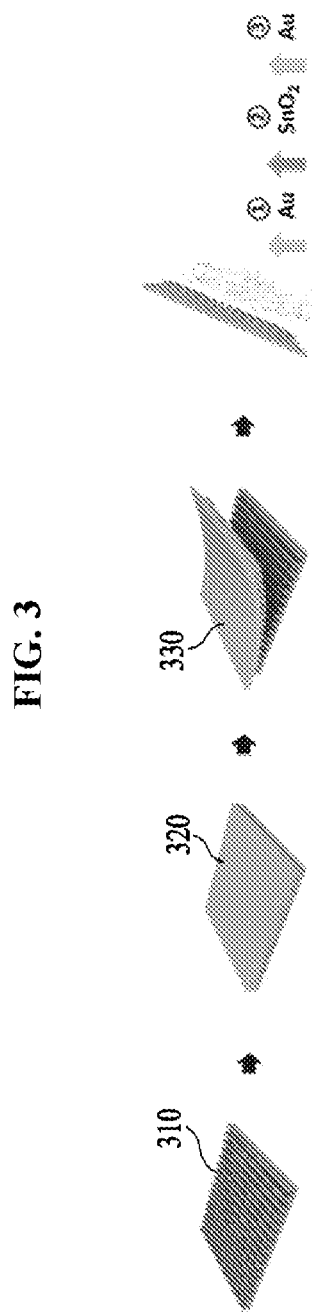
FIGS. 3 and 4 illustrate sequence diagrams of a method of manufacturing a multimodal sensor capable of simultaneously performing electrical/optical sensing according to an embodiment of the inventive concept.
Figure 4:
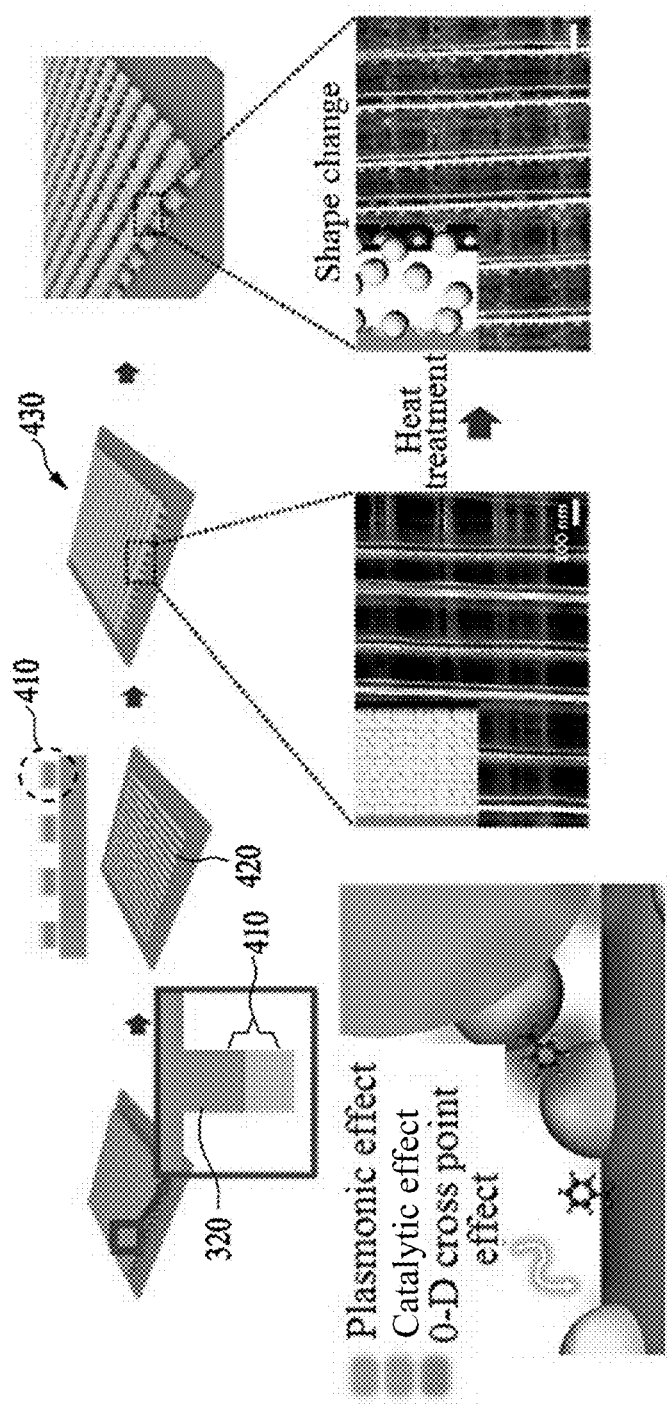

FIGS. 3 and 4 illustrate sequence diagrams of a method of manufacturing a multimodal sensor capable of simultaneously performing electrical/optical sensing according to an embodiment of the inventive concept.

In detail, FIG. 3 illustrates a sequence diagram of the method of manufacturing the nanowires each having the layered structure according to an embodiment of the inventive concept, and FIG. 4 illustrates a sequence diagram of the method of manufacturing the three-dimensional nanostructure according to an embodiment of the inventive concept.

Referring to FIG. 3, the method of manufacturing the multimodal sensor using the three-dimensional nanostructure according to an embodiment of the inventive concept includes applying the soft material on the master substrate on which a plurality of master patterns 310 is formed and separating the soft material from the master substrates using the adhesive film to form a base substrate 330 including base patterns 320 having a reverse phase of each master pattern 310. Thereafter, the inventive concept forms multi-layered nanowires each where a second functional material ① serving as the plasmonic metal material of at least one of gold (Au), silver (Ag), aluminum (Al), platinum (Pt), and copper (Cu), a first functional material ② serving as the metal oxide material of at least one of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$), and a second functional material ③ serving as the plasmonic metal material of at least one of gold (Au), silver (Ag), aluminum (Al), platinum (Pt), and copper (Cu) are sequentially deposited on the base patterns 320 included in the base substrate 330.

That is, each nanowire according to the embodiment of the inventive concept shows the multi-layered structure in which the second functional material, the first functional material, and the second functional material are sequentially stacked.

Referring to FIG. 4, nanowires 410 each having a multilayered are formed on the base patterns 320, respectively, by the method of manufacturing the nanowires shown in FIG. 3.

The method of manufacturing the multimodal sensor using the three-dimensional nanostructure according to an embodiment of the inventive concept includes contacting the base substrate 330, where the first functional material and the second functional material are provided on the base patterns 320, to a target substrate 420 such that the base patterns 320 faces the target substrate 420 and removing the base substrate 330 and the base patterns 320 bonded to the base substrate 330 to transfer nanowires 410 each including both the first functional material and the second functional material onto the target substrate 420. Accordingly, in the method of manufacturing the multimodal sensor using the three-dimensional nanostructure according to an embodiment of the inventive concept, the nanowires 410 are transferred to a plurality of layers on the target substrate 420 to form the three-dimensional nanostructure. Here, as illustrated in FIG. 4, in the inventive concept, the nanowires 410 may be transferred to a plurality of lattice-like layers on the target substrate 420 to form the three-dimensional nanostructure 430.

Hereinafter, in the method of manufacturing the multimodal sensor using the three-dimensional nanostructure according to an embodiment of the inventive concept, the three-dimensional nanostructure 430 may be heat-treated and the metal oxide material (the first functional material) may be stabilized and the plasmonic metal material (the second functional material) may be changed to the nanoparticles to maximize the optical properties of the three-dimensional nanostructure 430 through the heat treatment.

Figure 5:
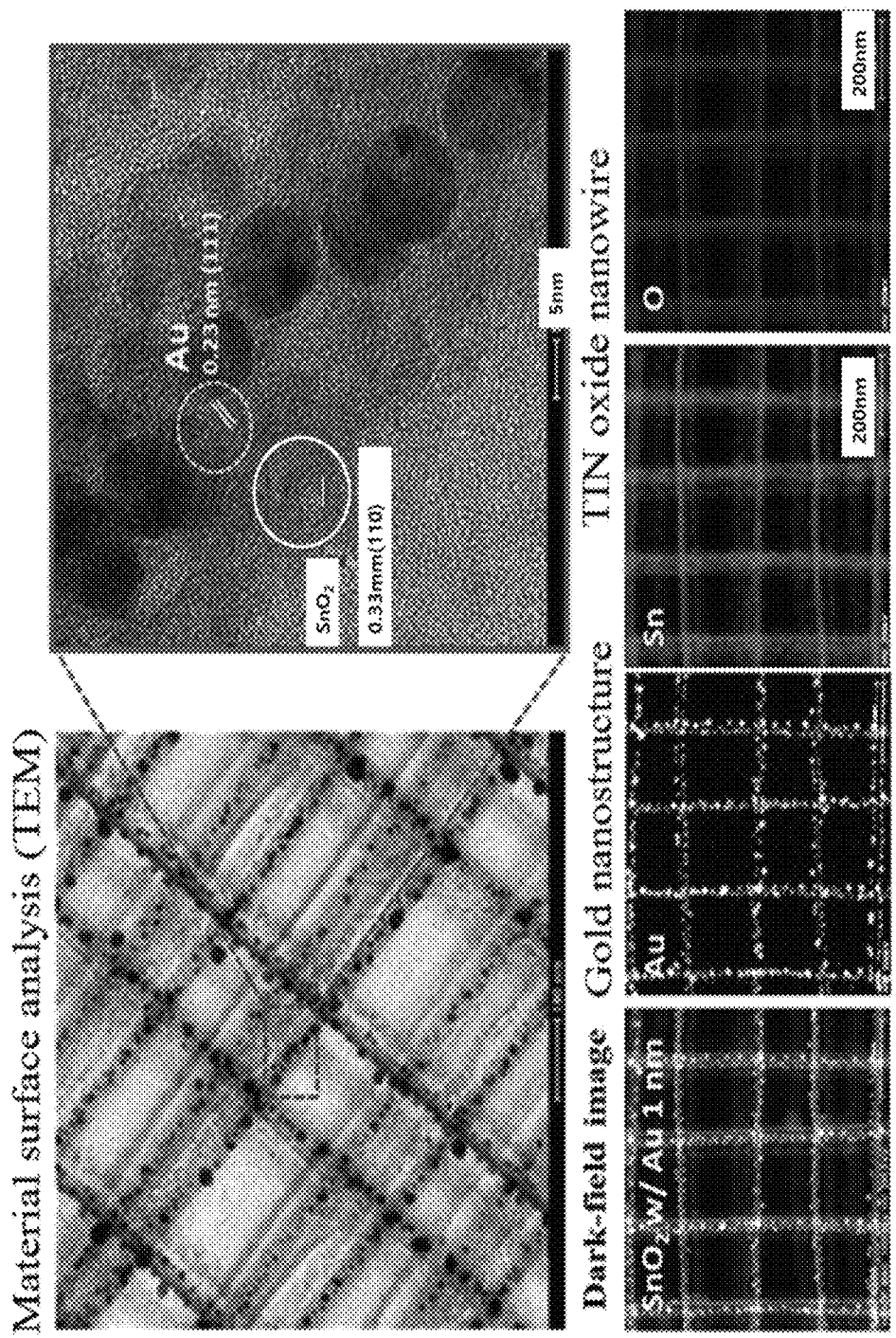
FIG. 5 illustrates a surface image of a multimodal sensing material in which a metal oxide material and a plasmonic metal material are present simultaneously according to an embodiment of the inventive concept.

FIG. 5 illustrates a surface image of a multimodal sensing material in which a metal oxide material and a plasmonic metal material are present simultaneously according to an embodiment of the inventive concept.

In detail, FIG. 5 illustrates the surface image of the multimodal sensing material including both the metal oxide material and the plasmonic metal material simultaneously using a transmission electron microscope (TEM).

Referring to FIG. 5, it may be confirmed that gold (Au) as the plasmonic metal material has a nanosphere shape and tin oxide ($SnO_2$) as the metal oxide material has a nanowire shape through the images obtained using the transmission electron microscope. Furthermore, it may be confirmed that tin oxide has a width of 50 nm and a thickness of 20 nm and gold has a diameter of 5 nm to 7 nm.

Figure 6:
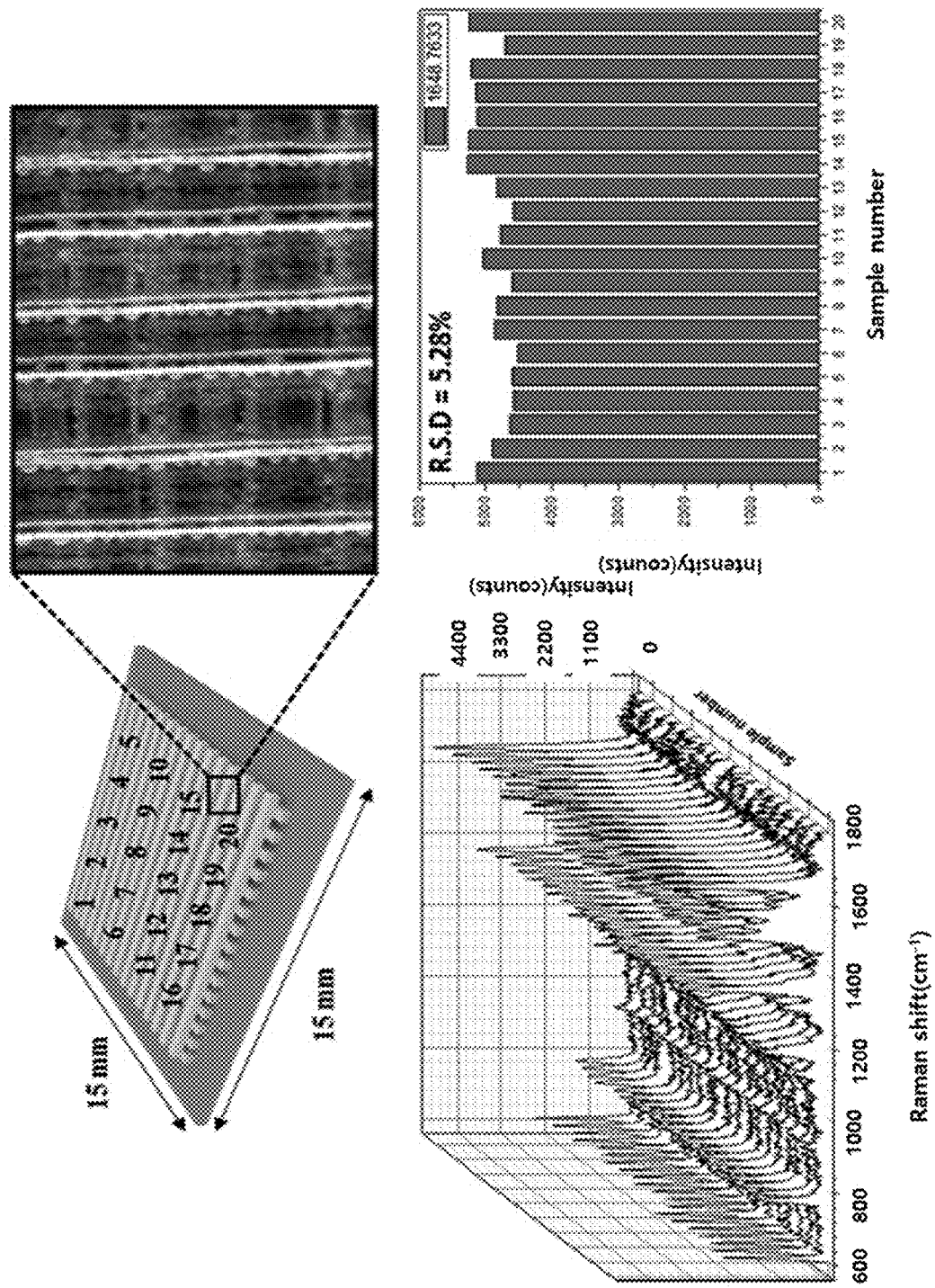
FIG. 6 shows results of evaluating uniformity of SERS signal magnitude and reproducibility for a multimodal sensor according to an embodiment of the inventive concept.

FIG. 6 shows results of evaluating uniformity of SERS signal magnitude and reproducibility for the multimodal sensor according to an embodiment of the inventive concept.

In detail, FIG. 6 shows signal intensities when signals are repeatedly detected at randomly selected points in the multimodal sensor according to an embodiment of the inventive concept.

Referring to FIG. 6, as the result of detecting the optical signals by selecting the random points in the multimodal sensor according to the embodiment of the inventive concept, it may be confirmed that the SERS signals have low variations at each point and represent comparatively uniform intensity. At the same time, it may be confirmed that the reproducibility is high when the signals are repeatedly detected and evaluated.

Figure 7B:
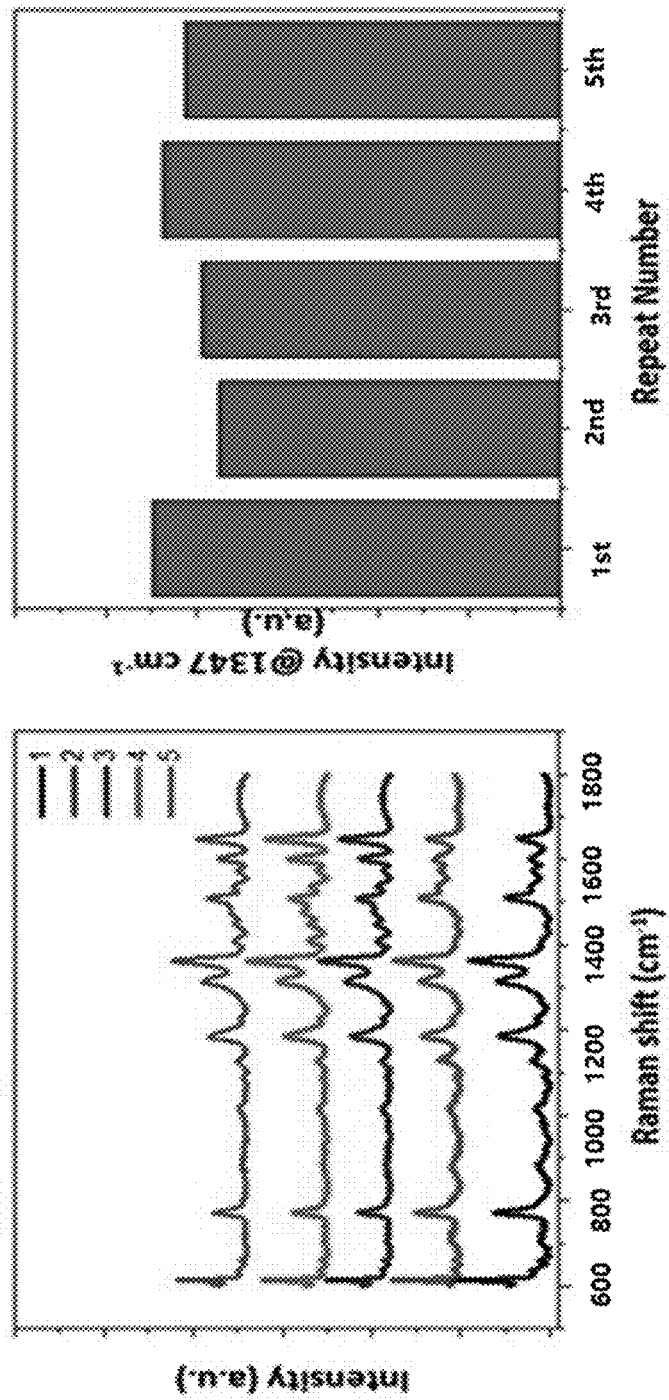

FIGS. 7A and 7B illustrate results of evaluating thermal stability of a multimodal sensor according to an embodiment of the inventive concept.

In detail, as random points in the multimodal sensor according to an embodiment of the inventive concept are selected to detect optical signals, FIGS. 7A and 7B show the results of evaluating the thermal stability due to an oxide supporting structure among synergistic effects of the manufactured multimodal sensing material.

A comparative example of FIG. 7A shows an image of a structural change as a result of heat treatment of a general nanostructure at a temperature of 200° C. for 30 minutes using a scanning electron microscope (SEM). FIG. 7B is a graph showing the thermal stability of the three-dimensional nanostructure according to an embodiment of the inventive concept with the optical signals measured after heat treatment at a temperature of 500 degrees for 30 minutes.

Referring to FIGS. 7A and 7B, it may be confirmed that the three-dimensional nanostructure having the oxide supporting structure according to an embodiment of the inventive concept shows the optical signals of uniform intensities compared with comparative example when repeating heat treatment five times at a temperature of 500° C. for 30 minutes.

Figure 8A:
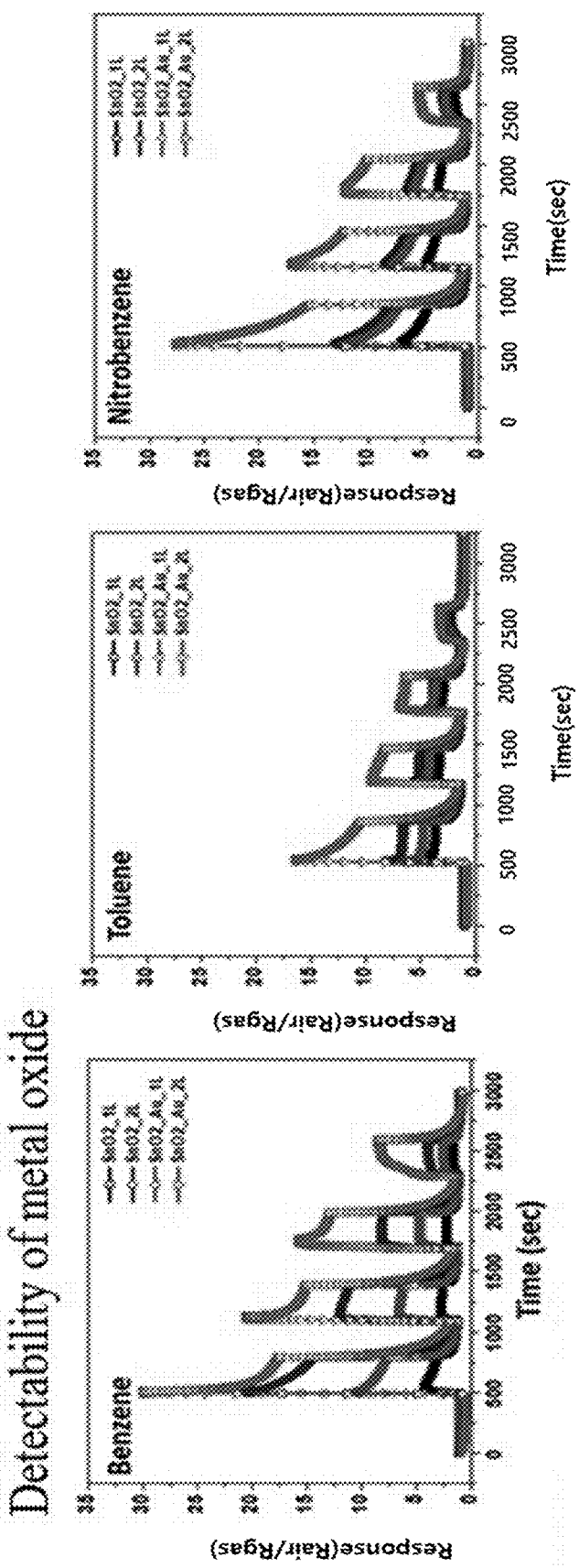
FIGS. 8A, 8B and 9 show results of evaluating detection characteristics of a multimodal sensor according to an embodiment of the inventive concept.
Figure 8B:
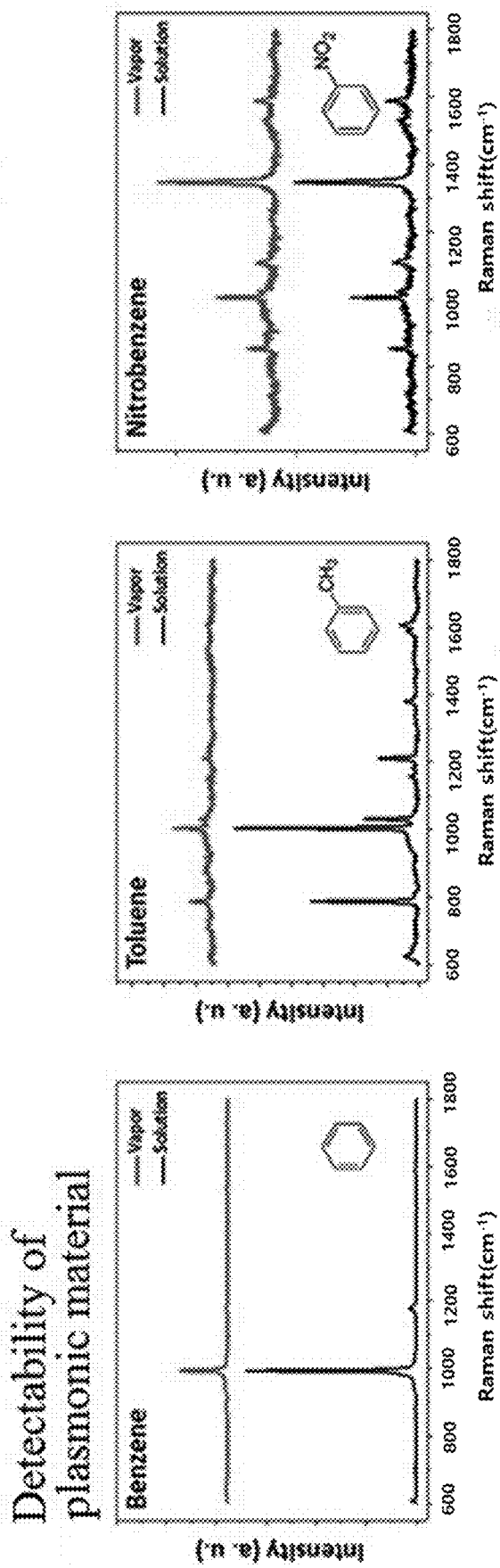
Figure 9:
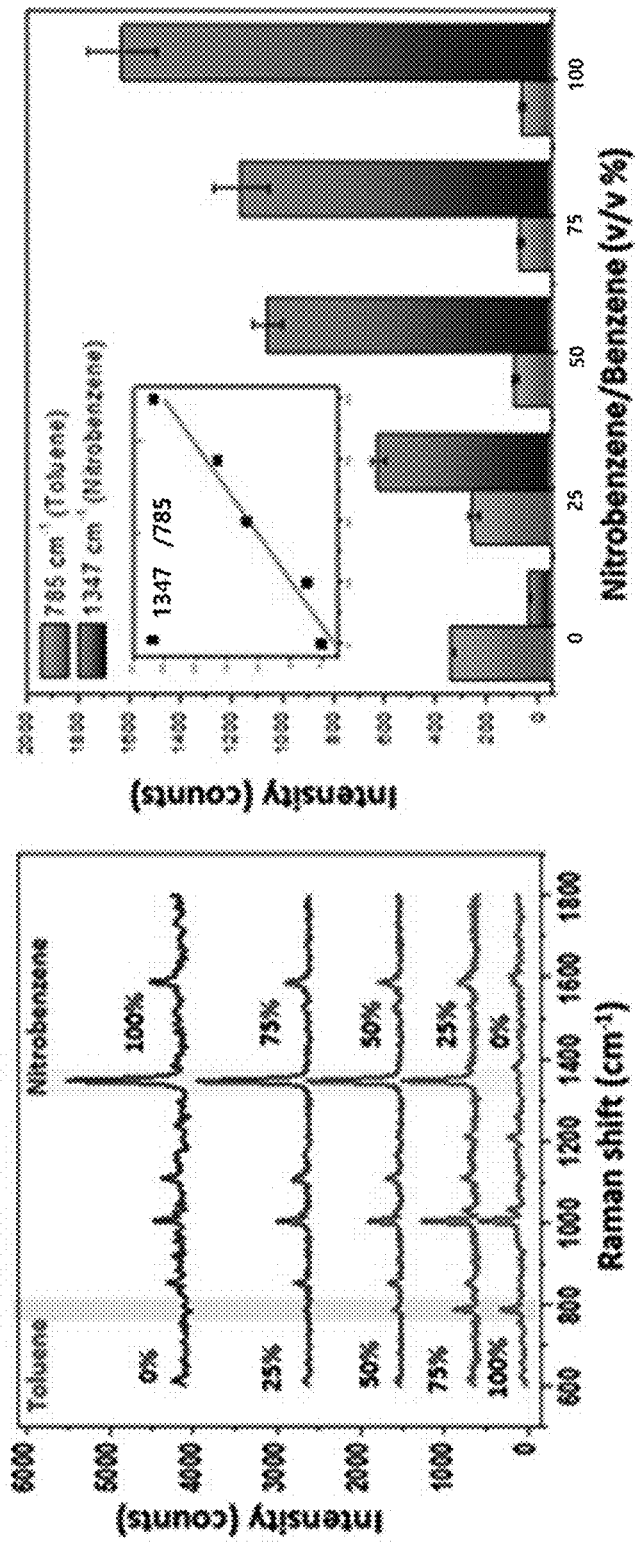

FIGS. 8A, 8B and 9 show results of evaluating detection characteristics of a multimodal sensor according to the embodiment of the inventive concept.

To be used as a multimodal sensor, each electrical and optical signal may be quantitatively measured in different sensing materials, and types of target molecules should be distinguishable.

Referring to FIGS. 8A and 8B, it may be conformed that the multimodal sensor according to an embodiment of the inventive concept detects a trace amount of the target molecules at ppm levels for each concentration and type. Furthermore, referring to FIG. 9, it may be expected that the multimodal sensor according to the embodiment of the inventive concept selectively discriminates the target molecules based on a ratio in a mixed gas.

That is, referring to FIGS. 8A, 8B and 9, it may be seen that the multimodal sensor according to the embodiment of the inventive concept quantitatively and selectively detects the target molecules even in the trace amount.

According to the embodiments of the inventive concept, the multimodal sensor with the high sensitivity and the high selectivity using the multifunctional three-dimensional nanostructure having electrical and optical sensing ability is provided, thereby being efficiently applied to a new sensor industry such as exhalation diagnose sensor, an anti-terrorism sensor, a drug detection sensor, and a food freshness measuring sensor, and the gas sensor industries in domestic and overseas.

In addition, according to the embodiment of the inventive concept, the multimodal sensor having the high sensitivity and the high selectivity, using the multifunctional three-dimensional nanostructure having the electrical and optical multimodal sensing ability may overcome the limitation of the sensor based on the one-dimensional sensing principle to induce the new sensing response. In particular, the multimodal sensor may be employed as the multifunctional catalyst which reads the multidimensional signals as well as the conventional catalyst function, which is a core function for enhancing the performance of the gas sensor. Furthermore, the multimodal sensor may maximize performance through control of the nanostructure, which is advantageous for sensing the gas and chemical substance, and therefore a direction of new sensor industries such as a next generation breath analyzer, a narcotics analyzer, a food freshness sensor, and an ultra-sensitive toxic substance detection sensor may be suggested.

Furthermore, according to the inventive concept, the multimodal sensor, in which the metal oxide material of the nanostructure is combined with the plasmonic metal material, may simultaneously detect the electrical signal of the metal oxide material and the optical signal amplified by the plasmonic nanostructure when the chemical substance is detected. In addition, the multimodal sensor may represent the different structure and approach from the conventional sensor and may have both the sensitivity and selectivity, which are limitations of the conventional sensor, at the same time.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of manufacturing a multimodal sensor using a three-dimensional nanostructure, the method comprising:
   forming multi-layered nanowires including a multifunctional material;
   transferring the multi-layered nanowires, each including both a first functional material and a second functional material, simultaneously to form a plurality of layers, each layer comprising a single multi-layered nanowire conforming to one of a plurality of base patterns, on a target substrate to form the three-dimensional nanostructure;
   heat-treating the three-dimensional nanostructure; and
   forming electrode layers including a first electrode pattern and a second electrode pattern which are formed on both sides of the heat-treated three-dimensional nanostructure, respectively, to form the multimodal sensor,
   wherein each of the multi-layered nanowires is formed by sequentially depositing the second functional material, the first functional material, and the second functional material on each of said base patterns, which are formed on a base substrate;
   wherein forming the nanowires includes:
      applying a material on a master substrate where a plurality of master patterns is formed, wherein the material is sufficiently soft to be molded by the plurality of master patterns;
      separating the material from the master substrate using an adhesive film and forming the base substrate, which includes the base patterns each having a reverse shape of each of the master patterns;
      depositing the first functional material on the base patterns; and
      depositing the second functional material having properties different from the first functional material on the first functional material to form the nanowires; and
   wherein the first electrode pattern and the second electrode pattern are electrically insulated from each other and are formed in an interdigitated type.

2. The method of claim 1, wherein the forming of the nanowires includes forming the nanowires each having a multi-layered structure where the second functional material is deposited on an upper end and lower end of the first functional material, respectively.

3. The method of claim 1, wherein the forming of the three-dimensional nanostructure includes contacting the base substrate provided with the first functional material and the second functional material to the target substrate and transferring the nanowires each including both the first functional material and the second functional material simultaneously onto the target substrate to form the three-dimensional nanostructure.

4. The method of claim 3, wherein the forming of the three-dimensional nanostructure includes transferring the multi-layered nanowires each including the first functional material having an electric response and the second functional material having an optical response onto the target substrate to form the three-dimensional nanostructure.

5. The method of claim 4, wherein the first functional material includes at least one metal oxide material of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$) and the second functional material includes at least one plasmonic metal material of gold (Au), silver (Ag), aluminum (Al), platinum (Pt), and copper (Cu).

6. The method of claim 1, wherein the forming of the nanowires includes depositing the multi-layered nanowires on the base substrate in a vacuum atmosphere using at least one of thermal evaporation, E-beam evaporation, and RF or DC sputtering, and
wherein the forming of the three-dimensional nanostructure includes contacting and transferring the base patterns where the multi-layered nanowires are deposited, respectively, onto the target substrate to form the three-dimensional nanostructure through continuous printing.

7. The method of claim 1, wherein the heat-treating includes heat-treating the three-dimensional nanostructure at a temperature of 500 degrees or more in a heat-treated air atmosphere.

8. A multimodal sensor using a three-dimensional nanostructure, the sensor comprising:
a target substrate;
a heat-treated three-dimensional nanostructure formed on the target substrate by transferring multi-layered nanowires, each including a first functional material and a second functional material, simultaneously to form a plurality of layers, each layer comprising a single multi-layered nanowire conforming to one of a plurality of base patterns; and
electrode layers including a first electrode pattern and a second electrode pattern, which are formed on both sides of the three-dimensional nanostructure, respectively,
wherein each multi-layered nanowire includes the second functional material, the first functional material, and the second functional material, which are sequentially deposited on each of said base patterns formed on a base substrate;
wherein the three-dimensional nanostructure is formed by transferring the multi-layered nanowires, each including the first functional material, which presents an electrical response, and the second functional material, which has properties different from properties of the first functional material and presents an optical response, simultaneously to the plurality of layers, and
wherein the first electrode pattern and the second electrode pattern are electrically insulated from each other and are formed in an interdigitated type.

9. The sensor of claim 8, wherein the first functional material includes at least one metal oxide material of tin oxide ($SnO_2$), zinc oxide (ZnO), tungsten oxide ($WO_3$), nickel oxide (NiO), titanium dioxide ($TiO_2$), hematite ($Fe_2O_3$), indium oxide ($In_2O_3$), niobium pentoxide ($Nb_2O_5$), tantalum pentoxide ($Ta_2O_5$), molybdenum trioxide ($MoO_3$), copper oxide (CuO), chromium oxide ($Cr_2O_3$), cobalt oxide ($Co_3O_4$), vanadium oxide ($V_2O_5$), and manganese oxide ($Mn_3O_4$) and the second functional material includes at least one plasmonic metal material of gold (Au), silver (Ag), aluminum (Al), platinum (Pt), and copper (Cu).

10. The sensor of claim 8, wherein the multi-layered nanowires are deposited on the base substrate using at least one of thermal evaporation, E-beam evaporation, and RF or DC sputtering,
wherein the three-dimensional nanostructure is formed by contacting and transferring the base patterns where the multi-layered nanowires are deposited, respectively, onto the target substrate, and continuous printing.

11. The sensor of claim 10, wherein the three-dimensional nanostructure is heat-treated at a temperature of 500 degrees or more in a heat-treated air atmosphere.

* * * * *